(12) United States Patent
Takagi et al.

(10) Patent No.: US 8,096,348 B2
(45) Date of Patent: Jan. 17, 2012

(54) HEAT EXCHANGER, METHOD OF MANUFACTURING HEAT EXCHANGER, LIQUID COOLING SYSTEM, LIGHT SOURCE DEVICE, PROJECTOR, ELECTRONIC DEVICE UNIT, AND ELECTRONIC EQUIPMENT

(75) Inventors: Kunihiko Takagi, Okaya (JP); Akira Egawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1301 days.

(21) Appl. No.: 11/538,602

(22) Filed: Oct. 4, 2006

(65) Prior Publication Data
US 2007/0084585 A1 Apr. 19, 2007

(30) Foreign Application Priority Data

Oct. 5, 2005 (JP) .................................. 2005-292192
Feb. 2, 2006 (JP) .................................. 2006-025761

(51) Int. Cl.
*F28F 3/14* (2006.01)
*F28F 3/12* (2006.01)
*F28F 7/00* (2006.01)

(52) U.S. Cl. .................... 165/170; 165/80.4; 165/168
(58) Field of Classification Search ............. 165/80.4, 165/185, 104.33, 170, 168; 361/699
See application file for complete search history.

(56) References Cited

U.S. PATENT DOCUMENTS

| | | | | |
|---|---|---|---|---|
| 4,386,505 A | * | 6/1983 | Little | 62/51.1 |
| 4,438,809 A | * | 3/1984 | Papis | 165/166 |
| 4,744,414 A | * | 5/1988 | Schon | 165/167 |
| 5,079,619 A | * | 1/1992 | Davidson | 257/714 |
| 5,125,451 A | * | 6/1992 | Matthews | 165/80.4 |
| 5,423,376 A | * | 6/1995 | Julien et al. | 165/80.4 |
| 5,835,345 A | * | 11/1998 | Staskus et al. | 361/699 |
| 6,959,492 B1 | | 11/2005 | Matsumoto et al. | |
| 6,994,829 B2 | | 2/2006 | Whyatt et al. | |
| 7,017,655 B2 | * | 3/2006 | Wilson et al. | 165/80.4 |
| 7,044,198 B2 | | 5/2006 | Matsushima et al. | |
| 7,297,324 B2 | | 11/2007 | TeGrotenhuis et al. | |
| 7,309,145 B2 | | 12/2007 | Nagata et al. | |
| 2002/0079087 A1 | * | 6/2002 | Vafai et al. | 165/80.4 |
| 2002/0101718 A1 | * | 8/2002 | Negishi et al. | 361/699 |
| 2003/0213580 A1 | * | 11/2003 | Philpott et al. | 165/46 |
| 2005/0022978 A1 | * | 2/2005 | Duval | 165/104.26 |
| 2005/0045309 A1 | | 3/2005 | Kondo et al. | |
| 2005/0133212 A1 | * | 6/2005 | Wilson et al. | 165/168 |

FOREIGN PATENT DOCUMENTS

| | | |
|---|---|---|
| CN | 1328632 A | 12/2001 |
| CN | 1624407 A | 6/2005 |
| CN | 1652017 A | 8/2005 |
| JP | A-61-115666 | 6/1986 |
| JP | A-2004-134797 | 4/2004 |
| JP | A-2005-11928 | 1/2005 |
| JP | A-2005-79483 | 3/2005 |
| JP | A 2005-166855 | 6/2005 |
| JP | A-2005-516171 | 6/2005 |

* cited by examiner

*Primary Examiner* — Cheryl J Tyler
*Assistant Examiner* — Brandon M Rosati
(74) *Attorney, Agent, or Firm* — Oliff & Berridge, PLC

(57) ABSTRACT

A method of manufacturing a heat exchanger having a plurality of fine flow channels includes forming a plurality of thin plate members into a predetermined shape, and laminating the plurality of thin plate members and bonding by diffusion bonding.

1 Claim, 12 Drawing Sheets

HEAT EXCHANGER, METHOD OF MANUFACTURING HEAT EXCHANGER, LIQUID COOLING SYSTEM, LIGHT SOURCE DEVICE, PROJECTOR, ELECTRONIC DEVICE UNIT, AND ELECTRONIC EQUIPMENT

BACKGROUND

1. Technical Field

The present invention relates to a heat exchanger having a plurality of fine flow channels, a method of manufacturing the heat exchanger, and so on.

2. Related Art

In recent years, reduction in size, increase in intensity, elongation in lifetime, reduction in cost, and so on have been attempted for a projector. For example, as regards reduction in size, the size of a liquid crystal panel (light modulation element) is on the order from 1.3 inches to 0.5 inches between opposed corners, and is reduced by ⅙ or a little more in area ratio.

Reduction in size is achieved by using a Light Emitting Diode (LED) or a Laser Diode (LD) which are solid light sources as a light source for the projector. The LED light source is compact including a power source, and has merits preferable as the light source for the projector, such that rapid ON-OFF is possible, the range of color reproduction is wide, a lifetime is long, and so on. Since harmful substances such as mercury is not included, it is preferable in terms of environmental protection.

However, since heat generation from the LED light source is increased and hence light emitting efficiency is lowered in association with increase in intensity of the LED light source or the like, it is necessary to take a countermeasure for heat generation. In a compulsory air-cooling system with a fan, which is generally employed, there are problems such that the cooling efficiency is not sufficient, or the fan makes a noise.

Therefore, there is proposed a method of compulsorily cooling the LED light source or the like using the heat exchanger having a plurality of flow channels for allowing passage of liquid. As such a heat exchanger, a method of forming a plurality of flow channels by laminating and brazing a plurality of thin plates as shown in JP-A-2005-166855.

However, in the technology shown above, there is a risk that a brazing filler metal used for joining the thin plates flows into the flow channels may clog the flow channels. Since brazing filler metal is interposed between the thin plates, there arises a problem such that coefficient of thermal conductivity in the direction of lamination of the thin plates is significantly lowered. In addition, since metal different from the thin plates is interposed occurrence of electrolytic corrosion becomes an issue.

SUMMARY

An advantage of some aspects of the invention is to provide a method of manufacturing a heat exchanger that can achieve desirable joint among thin plates when forming a plurality of fine flow channels by laminating thin plates.

In a heat exchanger, a method of manufacturing a heat exchanger, a liquid cooling system, a light source device, a protector, an electronic device unit, and electronic equipment according to an aspect of the invention, following configurations are employed in order to solve the above-described embodiment.

A first aspect of the invention is a method of manufacturing a heat exchanger having a plurality of fine flow channels including a step of forming a plurality of thin plate members into a predetermined shape, and a step of laminating the plurality of thin plate members and bonding by diffusion bonding.

In this configuration, since different metal does not exist between the thin plate members, the respective plate members can be well bonded. In addition, disadvantages such that the fine flow channels are clogged by the different metal, an electrolytic corrosion is occurred, or a thermal conductivity in the direction of lamination of the thin plates is lowered are reliably avoided.

The above-described diffusion bonding step includes a step of arranging a plurality of first thin plate members formed with voids which define the fine flow channels therebetween and a plurality of second thin plate members constituting partitioning walls between the fine flow channels alternately and arranging a third thin plate member formed with a through hole which communicates with the fine flow channels and a liquid feeding pipe connected to the through hole at one or both ends in the direction of lamination of the first thin plate members and the second thin plate members, and a step of applying a pressure to, at least, an area of the third thin plate member from which the liquid feeding pipe is avoided in the direction substantially parallel with the direction of lamination of the first thin plate members and the second thin plate members. With this step, even when the liquid feeding pipe is formed on a surface to which the pressure is applied, a substantially uniform pressure can be applied to the plurality of thin plate members by applying the pressure so as to avoid the liquid feeding pipe, whereby the desirable diffusion bonding can be achieved.

With a step of cutting the plurality of thin plate members integrated by the diffusion bonding into a plurality of pieces to isolate into individual heat exchangers, the plurality of heat exchangers can be manufactured substantially at the same time with high efficiency, and hence an inexpensive heat exchanger is realized.

According to a second aspect of the invention, a heat exchanger having a plurality of fine flow channels including a plurality of first thin plate members formed with voids which define the fine flow channels therebetween and a plurality of second thin plate members constituting partitioning walls between the fine flow channels, and the plurality of first thin plate members and the plurality of second thin plate members are bonded by diffusion bonding alternately. A heat exchanger having a plurality of fine flow channels have a first laminating plate, a second laminating plate, which constitutes liquid feeding pipes arranged of either side of the second laminating plate, a plurality of first thin plate members, each first thin plate member being formed with a first void in a middle of the first thin plate member, which defines a respective fine flow channel, a plurality of second thin plate members, each second thin plate member constituting a first partitioning wall in a middle of the second thin plate member and defining a respective fine flow channel on either side of the first partitioning wall, a plurality of third thin plate members, each third thin plate member being formed with a second void in a middle of the third thin plate member, which defines a respective fine flow channel, and an introduction flow path, being formed on both sides of the second void between an outer edge of the third thin plate member and the second void, a plurality of fourth thin plate members, each fourth thin plate member constituting a second partitioning wall in a middle of the fourth thin plate member, defining a respective fine flow channel on either side of the second partitioning wall, and the introduction flow path, being formed on both sides of the second partitioning wall between an outer edge of the fourth thin plate member and the second partitioning wall, wherein, the introduction flow path guides the liquid flow from one of the liquid feeding pipes into the heat exchanger, and then guides the liquid flow to an area that is a substantially center portion of the heat exchanger, the plurality of first thin plate members and the plurality of second thin plate members are bonded by diffusion bonding alternately to form alternating first thin plate members and second thin plate members, and the alternating first thin plate members and second thin plate members, including the first partitioning walls, are disposed in a direction perpendicular to the liquid feeding pipes, the plurality of third thin plate members and the plurality of fourth thin plate members are bonded by diffusion bonding alternately to form alternating third thin plate members and fourth thin plate members, and the alternating third thin plate members and fourth thin plate members, including the second partitioning walls, are disposed in a direction perpendicular to the liquid feeding pipes, the alternating first thin plate members and second thin plate members are disposed on the first laminating plate, the alternating third thin plate members and fourth thin plate members are disposed on the alternating first thin plate members and second thin plate members, and the second laminating plate is disposed on the alternating third thin plate members and fourth thin plate members.

In this configuration, since different metal does not exist between the thin plate members, the respective plate members can be well bonded. Accordingly, disadvantages such as clogging of the fine flow channels by the different metal, electrolytic corrosion, or lowering of thermal conductivity in the direction of lamination of the thin plates are reliably avoided.

In the configuration having a third thin plate member formed with a through hole which communicate with the fine flow channels at one or both ends of the first thin plate members and the second thin plate members, an inlet port and an outlet port for liquid can be formed at the same time.

With the configuration having a pipe joint portion to which the liquid feeding pipes can be connected formed at the end surface of the through hole, an inlet pipe and an outlet pipe for liquid can be connected easily.

A third aspect of the invention is a liquid cooling system including a heat absorber which comes into thermally contact with a heat generating member; a pump for supplying liquid for the heat absorber, and a radiator for radiating heat from liquid discharged from the heat absorber, wherein the heat exchanger manufactured according to the first aspect of the invention, or the heat exchanger according to the second aspect of the invention is employed as the heat absorber.

In this configuration, even though a contact surface area with the heat generating part is small, the liquid cooling system having high heat exchanging efficiency can be realized.

A fourth aspect of the invention is a light source device including a solid light-emitting light source which emits light and generates heat by being supplied with an electric current and a liquid cooling unit for cooling the solid light-emitting light source, wherein the liquid cooling system according to the third aspect of the invention is employed.

In this configuration, since heat generation of the solid light-emitting light source can be controlled efficiently, the light source device with high intensity is realized.

According to a fifth aspect of the invention, a projector includes the light source device according to the fourth aspect of the invention. In this configuration, a compact projector with high intensity can be realized.

A sixth aspect of the invention is an electronic device unit having an electronic device which generates heat by being supplied with an electric current, and a liquid cooling unit for cooling the electronic device, wherein the liquid cooling system according to the third aspect of the invention is employed as the liquid cooling unit.

With this configuration, since heat generation of the electronic device can be controlled efficiently, an electronic device unit with high throughput can be realized.

According to a seventh aspect of the invention, electronic equipment includes the electronic device unit according to the sixth aspect of the invention. In this configuration, compact electronic equipment with high throughput can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
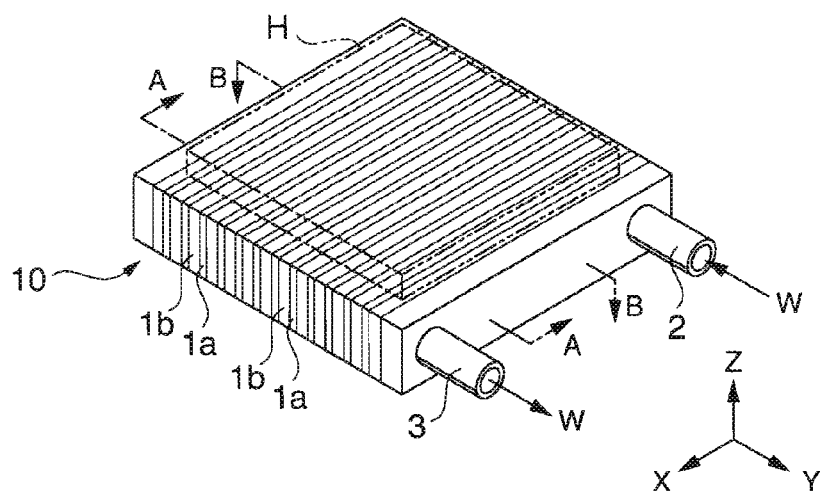
FIGS. 1A to 1C illustrate schematic configurations of a heat exchanger.

Referring now to the drawings, embodiments of a heat exchanger, a method of manufacturing a heat exchanger, a liquid cooling system, a light source device, a projector, an electronic device unit, and electronic equipment according to some aspects of the invention will be described below.

Heat Exchanger

Figure 1B:
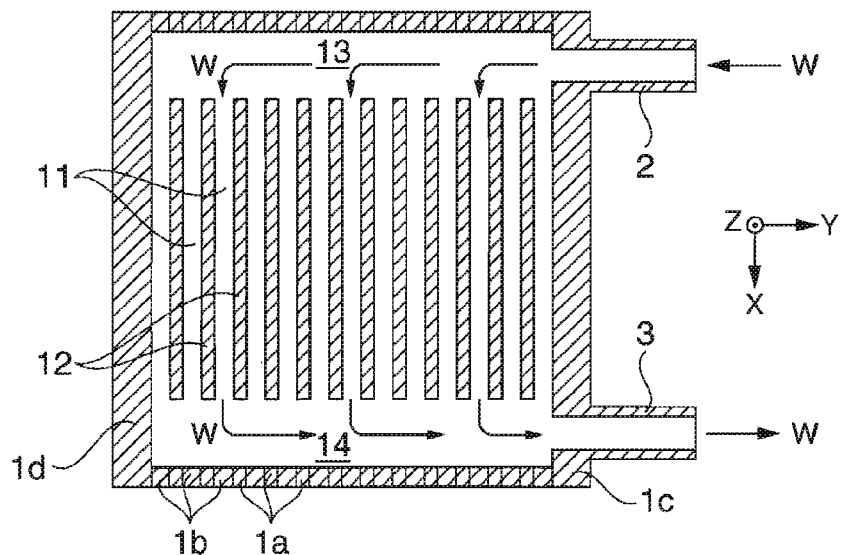
Figure 1C:
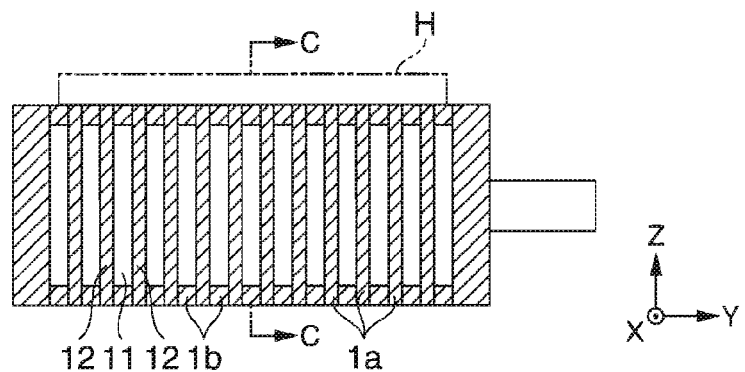

FIGS. 1A to 1C illustrate schematic configurations of the heat exchanger, in which FIG. 1A is a perspective view, FIG. 1B is a vertical cross-sectional view, and FIG. 1C is a lateral cross-sectional view.

A heat exchanger 10 is a plate-shaped member formed by laminating a plurality of metal thin plates (laminating plates 1a, 1b, and so on) having a high thermal conductivity such as copper or aluminum, and includes a plurality of fine flow channels 11 for allowing liquid such as water W to flow in the interior thereof.

As shown in FIG. 1A, an inlet pipe 2 for introducing water W into the interior thereof and an outlet pipe 3 for allowing water W introduced into the interior thereof to be discharged are connected to a side surface of the heat exchanger 10. A main surface of the heat exchanger 10 is formed into a flat shape to allow contact with a heat generating member H.

A direction orthogonal to the main surface that come into contact with the heat generating member H (the direction of thickness of the heat exchanger 10) is represented by Z-direction, and the direction of flow of water W in the flow channel 11 is represented by X-direction.

As shown in FIG. 1B, the plurality of fine flow channels 11 are formed in the interior of the heat exchanger 10. These flow channels 11 are formed to have a cross section whose aspect ratio is high for securing a large contact surface area with water W. More specifically, as shown in FIG. 1C, the flow channel 11 is formed into a substantially rectangular shape having a height of 2 to 3 mm and a width of about 50 to 100 µm.

In this configuration, water W introduced from the inlet pipe 2 to the interior of the heat exchanger 10 is separately flowed through the plurality of fine flow channels 11, and then discharged from the outlet pine 3 toward the outside. The flow amount of water W is, for example, about 3 cc/second.

Figure 2A:
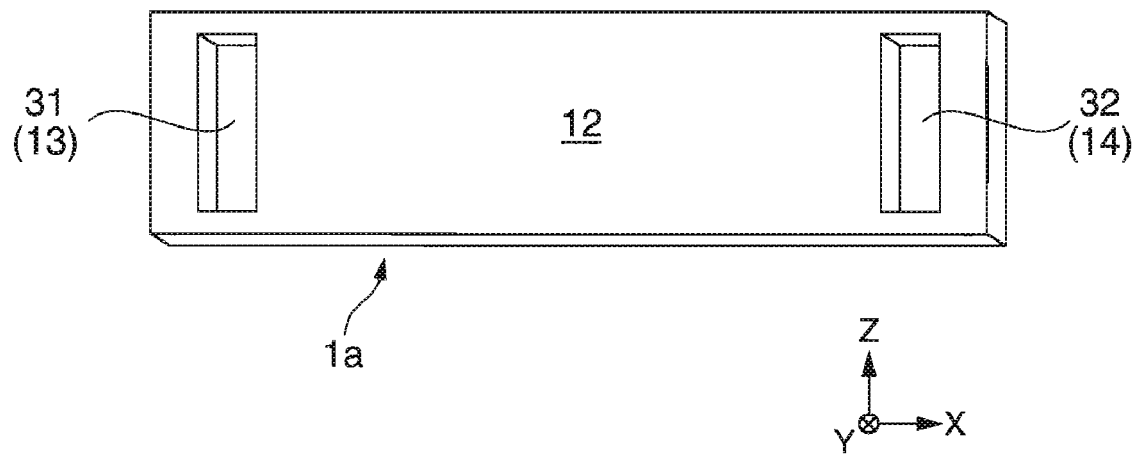
FIGS. 2A and 2B each illustrates a laminating plate.
Figure 2B:
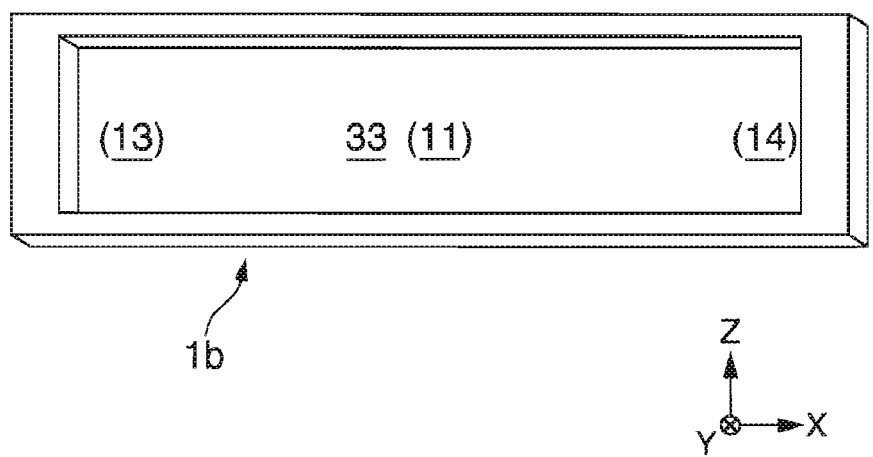

FIGS. 2A and 2B are drawings showing a laminating plate.

As described above, the heat exchanger 10 is formed by laminating the laminating plates 1a, 1b and so on having high thermal conductivity such as copper or aluminum. The laminating plates 1a, 1b, being formed into a predetermined shape by a punching process or an etching process, are laminated, and then pressurized and heated to cause diffusion bonding, whereby the heat exchanger 10 is configured.

The laminating plates 1a (first thin plate members) are thin plate members for constituting partitioning walls 12 for partitioning the plurality of flow channels 11 formed in the interior of the heat exchanger 10. The laminating plate 1a is solid at a rectangular center portion thereof and is formed with through hole portions 31, 32 at both end sides in the longitudinal direction as shown in FIG. 2A. The solid portion at the center constitutes the partitioning wall 12. On the other hand, the through hole portions 31, 32 are part of the flow channels formed in the interior of the heat exchanger 10, and constitute void portions 13, 14 (see FIG. 1B) formed on an upstream side and a downstream side of the plurality of fine flow channels 11.

The void portions 13, 14 are spaces formed to allow water W to flow substantially evenly through the plurality of flow channels 11. In FIG. 2A, the through hole portion 31 is formed into a rectangular shape, it may be formed into a circular shape or the like.

The laminating plate 1b (second thin plate member) is a thin plate member for constituting the plurality of flow channels 11 formed in the interior of the heat exchanger 10. The laminating plate 1b is formed into a rectangular frame shape as shown in FIG. 2B, and a center portion of a through hole portion 33 on the inner side constitutes the flow channel 11, and longitudinal both end sides of the through hole portion 33 constitute the void portions 13, 14 formed on the upstream side and the downstream side of the flow channel 11.

The contour of the laminating plate 1b is the same as the laminating plate 1a, and a part of the through hole portion 33 of the laminating plate 1b is formed to match a part of the through hole portions 31, 32 on the laminating plate 1a.

When these members are pressurized and heated, mutual diffusion is effected at a contact portion, and these two members are bonded. A bonding method utilizing this phenomenon is the diffusion bonding. This bonding is not achieved instantaneously, but is achieved in such a procedure that the members are partly bonded first, the bonded portion is enlarged due to a surface tension at a pointed portion of a contact end, and the non-bonded portion (referred to as "void") is reduced and is gradually disappeared, whereby the whole contact surfaces are bonded.

Since a base material is not converted into a liquid phase when bonding, there is no potential for clogging of the flow channel 11 by brazing filler metal flowed into the flow channel 11 as in the case in which the brazing filler metal is employed. Since the brazing filler metal is interposed between the laminating plates 1a, 1b, there is no potential for significant lowering of thermal conductivity in the direction of lamination. Since metal different from the laminating plates 1a, 1b is interposed, there is no potential for occurrence of electrolytic corrosion.

In this manner, by laminating the laminating plates 1a, 1b and bonding by diffusion bonding, the heat exchanger 10 having the plurality of flow channels 11 of fine cross-section can be well formed.

As shown in FIG. 1B, a laminating plate 1c (third thin plate member) or a laminating plate 1d arranged at both ends in the direction of lamination of the heat exchanger 10 may be provided with the inlet pipe 2 and the outlet pipe 3 in advance. The laminating plate 1c or the laminating plate 1d is also bonded by diffusion bonding simultaneously with the laminating plates 1a, 1b.

The diffusion bonding is achieved generally by applying a compression force in the direction substantially in parallel with the direction of lamination onto the laminated laminating plates 1a to 1d, and being heated to a temperature on the order of 500 to 800° C. The diffusion bonding is carried out at a low pressure (for example, in vacuo). It is for preventing corrosion (oxidation) of the laminating plates 1a to 1d.

Figure 3:
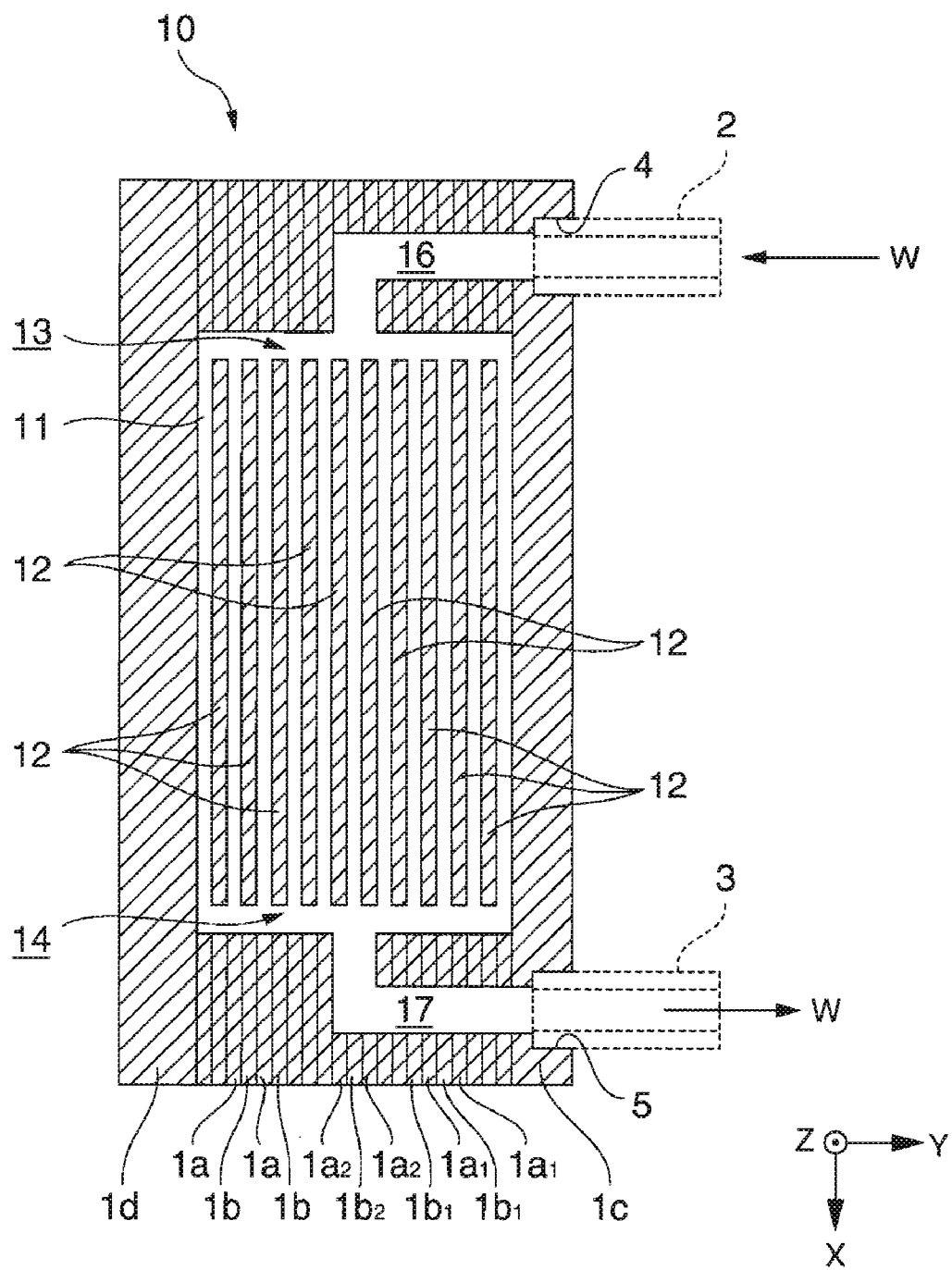
FIG. 3 is a cross-sectional view showing a modification of an internal structure of the heat exchanger.
Figure 4A:
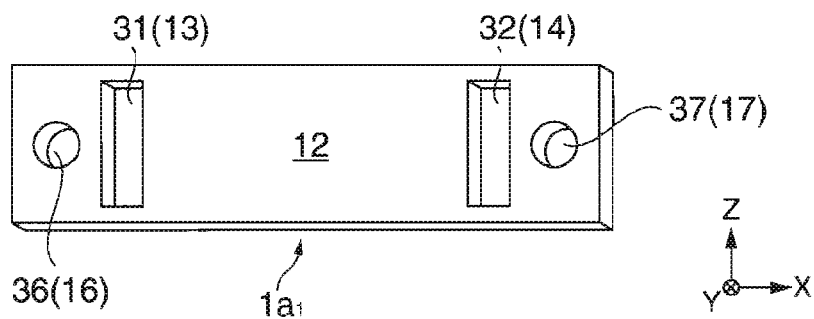
FIGS. 4A to 4D illustrate modifications of the laminating plate.
Figure 4B:
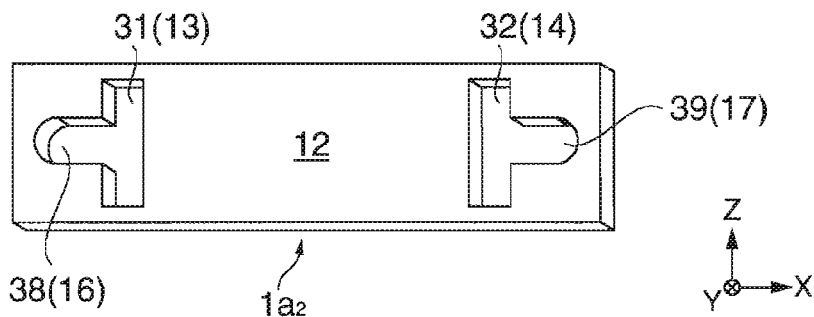
Figure 4C:
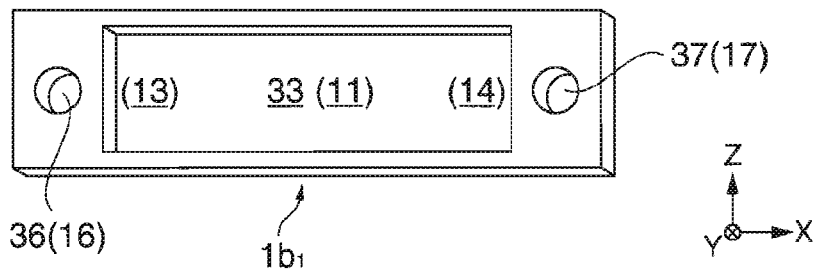
Figure 4D:
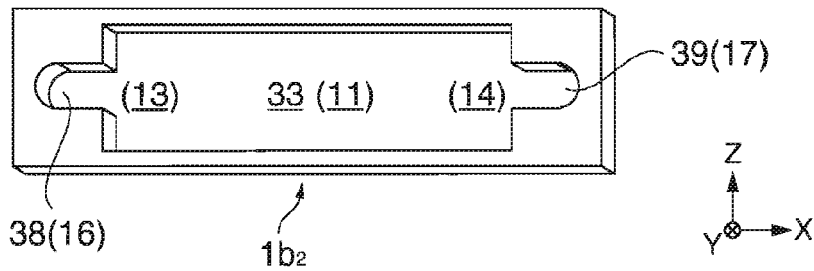

FIG. 3 is a cross-sectional view showing a modification of an internal structure of the heat exchanger. FIGS. 4A to 4D are drawings showing modifications of the laminating plate.

As shown in FIG. 3, introduction flow channels 16, 17 which communicate from the inlet pipe 2 and the outlet pipe 3 to the position near the flow channel 11 at the center portion in the heat exchanger 10 may be formed for facilitating flow of water W toward the flow channel 11 at the center portion among the plurality of flow channels 11. In this case, the void portions 13, 14 are narrowed in comparison with the case shown in FIG. 1B. The introduction flow channels 16, 17 are defined by the laminating plates 1a, 1b.

In other words, the laminating plates (laminating plates $1a_1$, $1a_2$, $1b_1$, $1b_2$) which are arranged on the side of the inlet pipe 2 and the outlet pipe 3 from the portion near the flow channel 11 at the center portion out of the laminating plates 1a, 1b are formed with a through hole portion 36 or the like.

More specifically, as shown in FIGS. 4A to 4D, the laminating plates $1a_1$, $1b_1$ are further formed with the through hole portions 36, 37 that define portions which connect the inlet pipe 2 and the outlet pipe 3 (portions communicating in the Y-direction). The laminating plates $1a_2$, $1b_2$ are further formed with a through hole 19 which defines portion to be connected to the void portions 13, 14 (a portion communicating in the X-direction).

In FIG. 3, the laminating plate 1c or the laminating plate 1d may be formed with pipe fitting holes 4, 5 for connecting the inlet pipe 2 and the outlet pipe 3 in advance.

In this embodiment, the case in which the laminating plates 1a, 1b and so on are laminated in the Y-direction has been described, it may be formed by laminating in the x-direction.

Figure 5A:
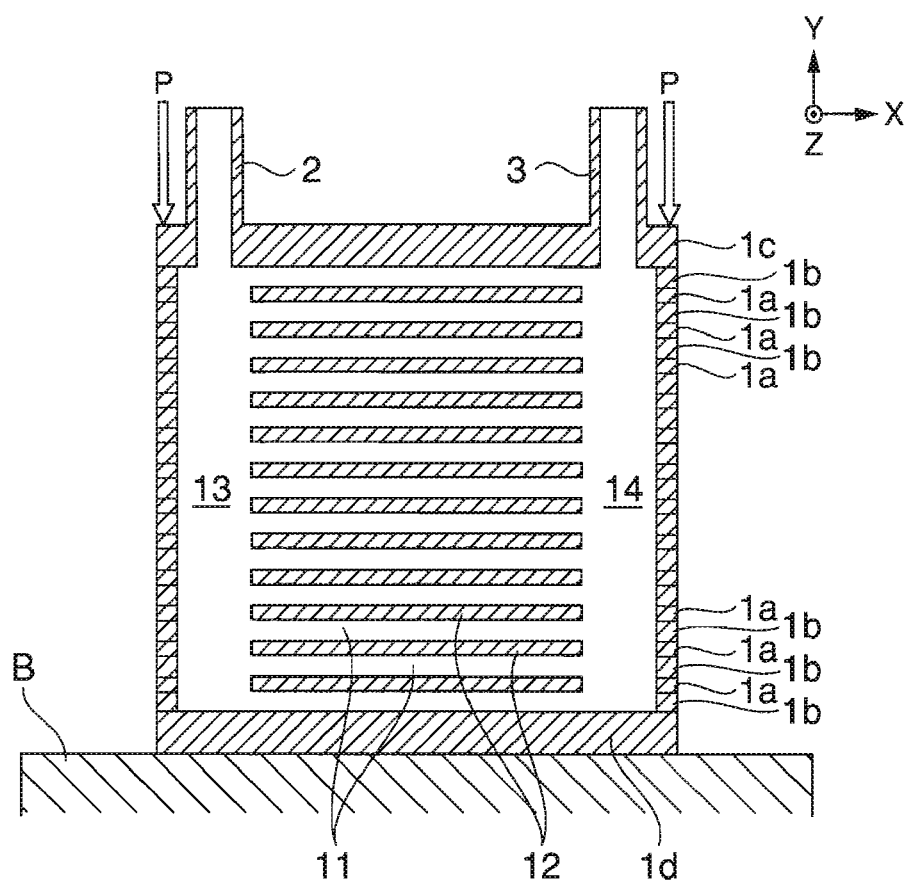
FIGS. 5A and 5B illustrate a method of applying a pressure to the laminating plate at the time of diffusion bonding.
Figure 5B:
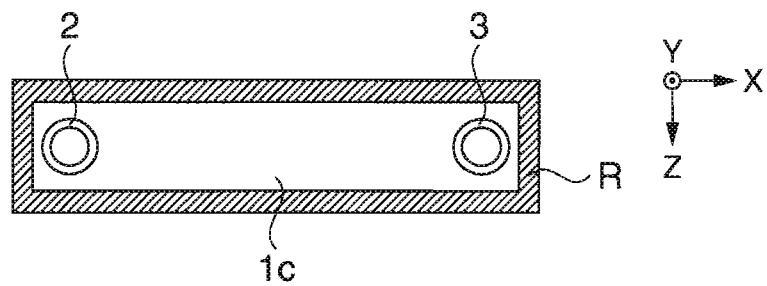

FIGS. 5A and 5B illustrate a method of applying a pressure to the laminating plate for the diffusion bonding.

When bonding the laminating plates 1a to 1d by diffusion bonding, it is necessary to laminate the laminating plates 1a to 1d and apply a pressure in the direction substantially in parallel with the direction of lamination. However, since the laminating plate 1c is formed with the inlet pipe 2 and the outlet pipe 3 in advance, it is necessary to apply a pressure to a range from which the inlet pipe 2 and the outlet pipe 3 are avoided.

More specifically, as shown in FIG. 5A, the laminating plates 1a to 1d are laminated and placed so that the laminating plate 1d comes into tight contact with a machine plate B. Then, as shown in FIG. 5B, a pressure P is applied to a range R on the laminating plate 1c from which the inlet pipe 2 and the outlet pipe 3 are avoided.

Accordingly, since a pressure is applied substantially uniformly on the laminating plates 1a to 1d which constitute the heat exchanger 10 in the direction of lamination, these laminating plates 1a to 1d are well bonded.

Figure 6A:
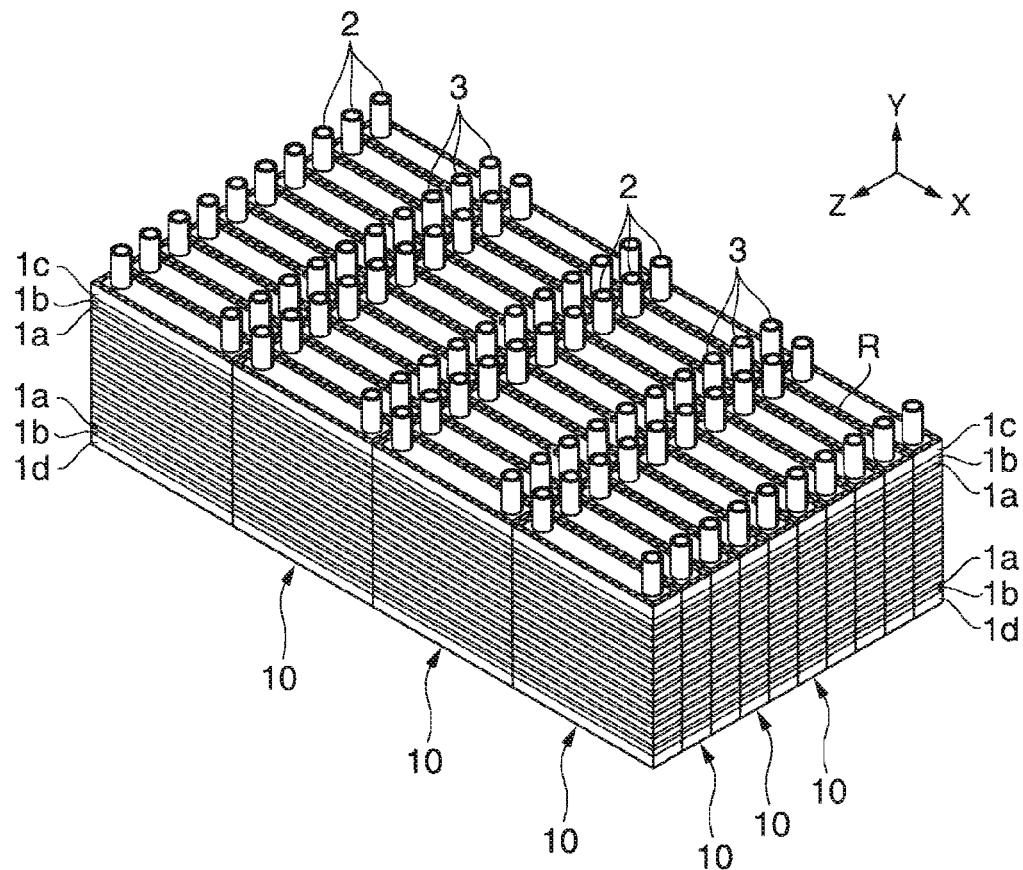
FIGS. 6A and 6B illustrate a method of manufacturing a plurality of the heat exchangers substantially at the same time.
Figure 6B:
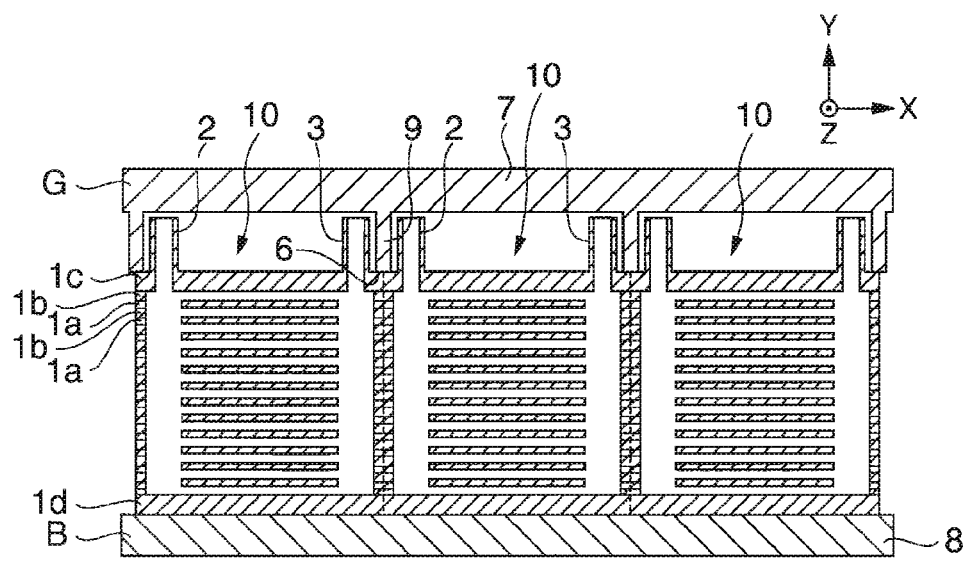

FIGS. 6A and 6B illustrate a method of manufacturing a plurality of the heat exchangers 10 substantially at the same time.

The size of the heat exchanger 10 is about several cubic centimeters. Therefore, a method of manufacturing the heat exchanger 10 individually by forming, laminating and bonding small laminating plates 1a to 1d by diffusion bonding is not efficient.

Therefore, the respective laminating plates 1a to 1d are formed in a state in which a plurality of those are connected in the X-direction and in the Z-direction (see FIGS. 1A to 1C, FIGS. 4A to 4D). Then, the laminating plates 1a to 1d formed in this manner are laminated in sequence in the Y-direction, and bonded by diffusion bonding. Accordingly, the plurality of heat exchangers 10 are manufactured in a state of being connected in the X-direction and the Z-direction as shown in FIG. 6A.

When applying the pressure P to the laminating plate 1c, the pressure P is applied to the range R from which the inlet pipe 2 and the outlet pipe 3 are avoided as described above. For example, the range R on the laminating plate 1c is pressed with a jig G as shown in FIG. 6B.

Then, the plurality of heat exchangers 10 connected integrally in this manner are cut into individual pieces with a wire saw or the like. More specifically, the plurality of heat exchangers 10 are obtained by cutting along the broken lines shown in FIG. 6A.

With the manufacturing method as described above, the plurality of heat exchangers 10 can be manufactured efficiently, and the cost of the heat exchanger 10 can be reduced.

Liquid Cooling System

Subsequently, a liquid cooling system 20 provided with the heat exchanger 10 will be described.

Figure 7:
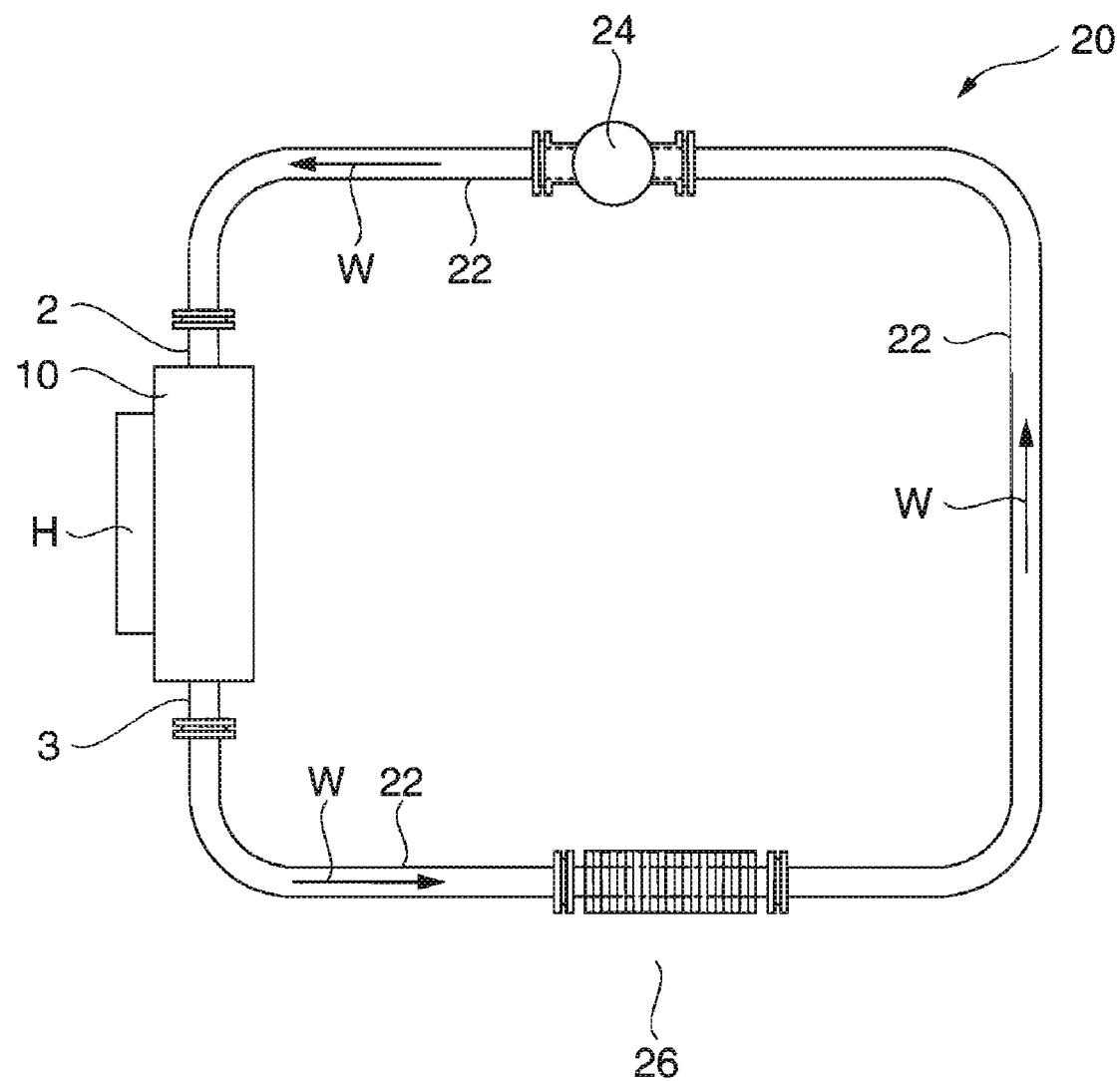
FIG. 7 is a drawing showing a schematic configuration of a liquid cooling system.

FIG. 7 is a drawing showing a schematic configuration of the liquid cooling system 20.

The liquid cooling system 20 includes the heat exchanger 10, liquid feeding pipes 22 to be connected to the inlet pipe 2 and the outlet pipe 3 of the heat exchanger 10, a pump 24 provided on the liquid feeding pipe 22 on the side of the inlet pipe 2, and a radiator 26 provided on the liquid feeding pipe 22 on the side of the outlet pipe 3.

In this configuration, water W is supplied from the pump 24 through the liquid feeding pipes 22 and the inlet pipe 2 to the interior of the heat exchanger 10. The heat exchanger 10 comes into contact with the heat generating member H, and heat from the heat generating member H is transmitted to water W flowing in the flow channel 11 in the interior thereof. The water W heated by absorbing heat from the heat generating member H is introduced from the outlet pipe 3 into the radiator 26 via the liquid feeding pipe 22. Then in the radiator 26, the heat of the water W is radiated into the atmosphere.

With the liquid cooling system 20, since many flow channels 11, of which aspect ratio of the cross-section is high, are provided inside the heat exchanger 10, the efficiency of heat exchange is high even though the contact surface area with respect to the heat generating member H is small. Therefore, the heat generating member H can be cooled efficiently.

Light Source Device

Subsequently, a light source device 100 provided with the liquid cooling system 20 will be described.

Figure 8:
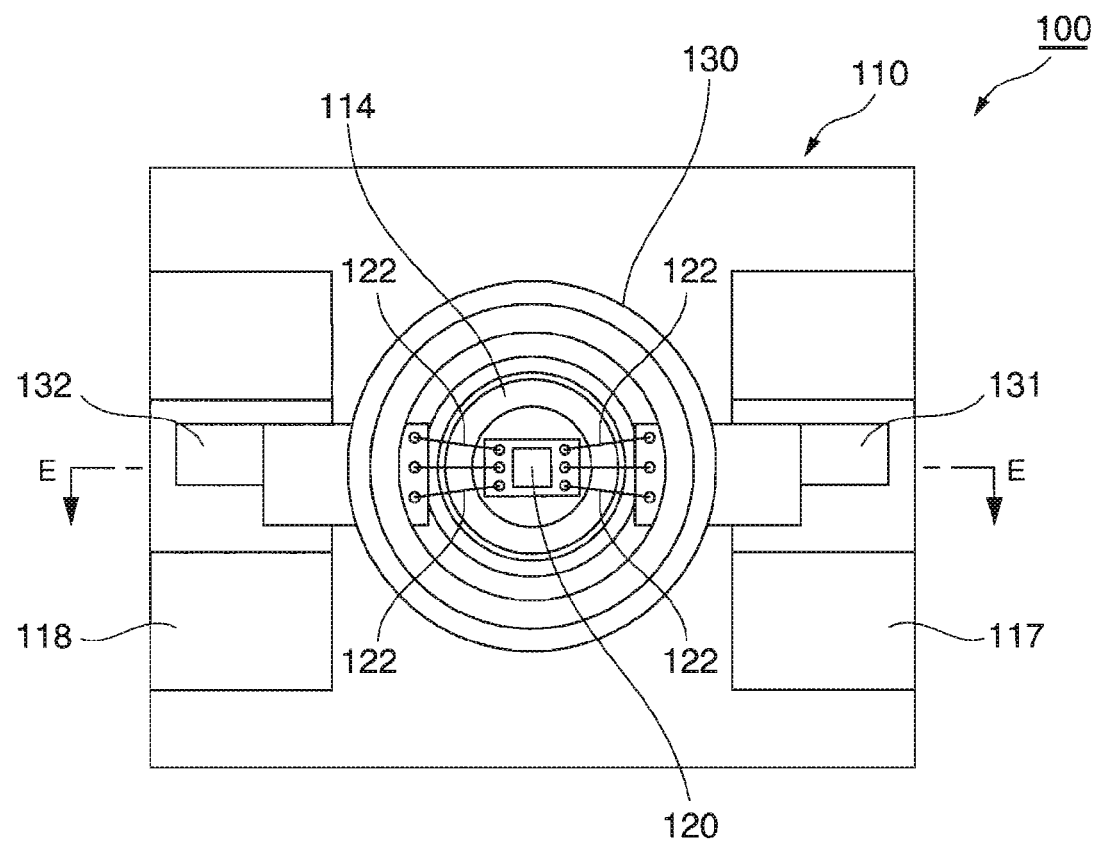
FIG. 8 is a plan view showing a schematic configuration of a light source device.
Figure 9:
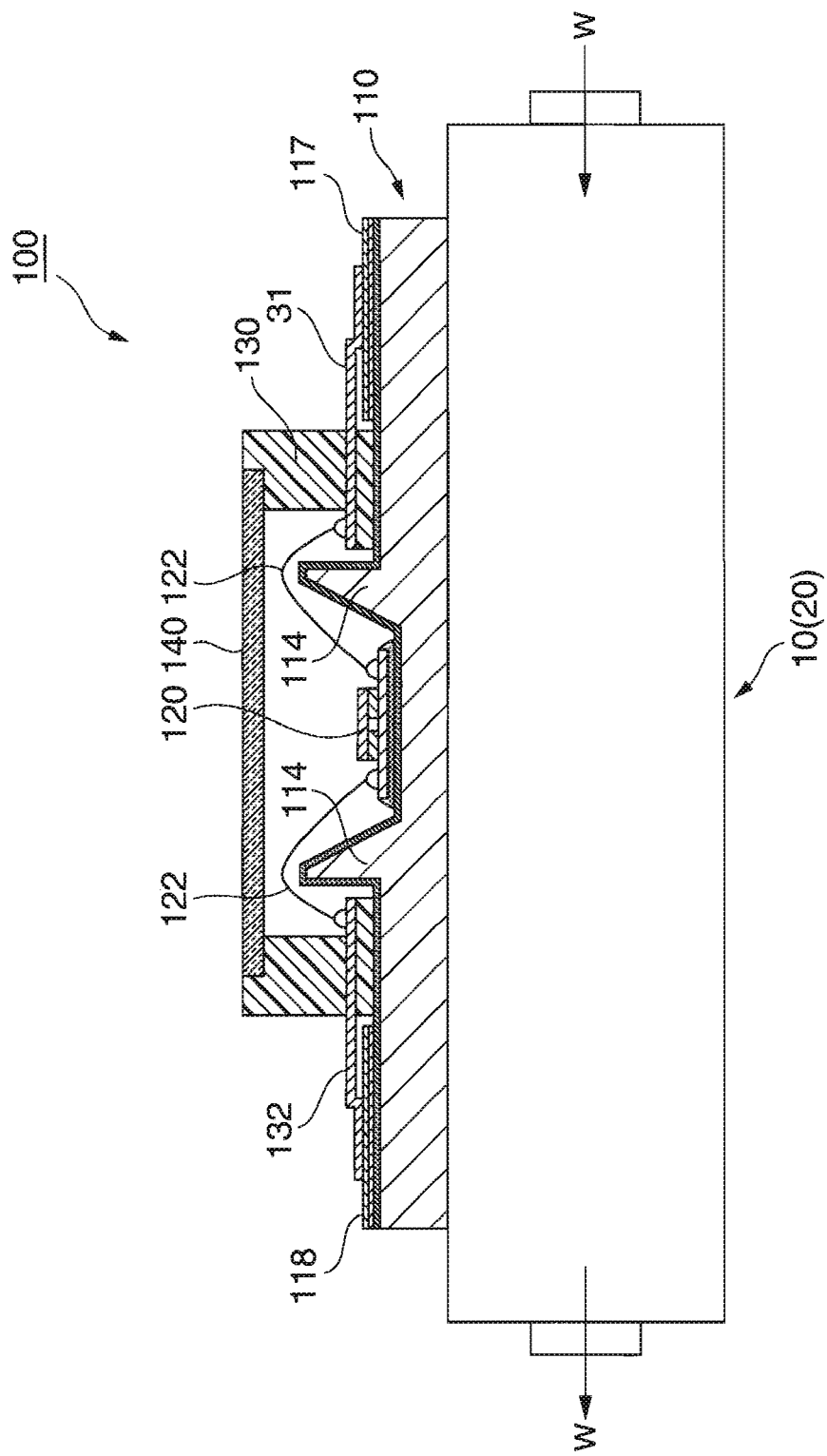
FIG. 9 is a cross-sectional view of the light source device.

FIG. 8 is a plan view showing a schematic configuration of the light source device 10, and FIG. 9 is a cross-sectional view of the light source device 100.

The light source device 100 includes a base table 110, an LED chip 120 (solid light-emitting source), a resin frame 130 and a cap 140.

The base table 110 is for placing the LED chip 120, and is connected to the liquid cooling system 20 in tight contact thereto.

The LED chip 120 is a member for emitting light and generating heat by being supplied with an electric current, is mounted on a sub mount formed of silicon or the like and formed with wiring for supplying power to the LED chip 120 as a flip chip, and is mounted on the base table 110 with heat conductive adhesive agent (for example, silver paste) together with the sub mount.

A reflector 114 is arranged on an upper surface of the first base table 110, and the resin frame 130 is arranged so as to surround the reflector 114. Then, the cap 140 is arranged by being supported by an upper portion of the resin frame 130, and silicone oil or the like is filled in a space defined by the cap 140 and the resin frame 130.

As shown in FIG. 8 and FIG. 9, the resin frame 130 is provided with outer leads 131, 132 insert-molded thereon, and the respective outer leads 131, 132 are connected to flexible boards 117, 118 arranged on the base 110 at one end thereof and are connected to a connecting pad formed on a sub mount 121 by gold wires 122 or the like at the other end. Electric power is supplied to the LED chip 120 via the sub mount 121, the flexible boards 117, 118, the outer leads 131, 132 and the gold wires 122.

In this embodiment, three each of gold wires 122 are connected to the respective outer leads 131, 132. However, the number of the gold wires 122 is to be changed according to the amount of electricity supplied to the LED chip 120.

In the light source device 100 configured in this manner, when an electric current is supplied to the LED chip 120, light is emitted from the LED chip 120, and the emitted light is emitted from the light source device 100 via the cap 140. The light emitted sideward from the LED chip 120 is reflected toward the cap 140 by the reflector 114, and then, is emitted from the light source device 100 via the cap 140.

In the light source device 100, since the water cooling system 20 (heat exchanger 10) is connected to the base table 110 in tight contact therewith, the LED chip 120 can be cooled efficiently by flowing water W in the flow channel 11 of the heat exchanger 10, and hence the LED chip 120 can be prevented from being damaged by heat. Therefore, the light source device 100 with high intensity and high reliability can be provided.

Projector

Subsequently, a projector 500 provided with the light source device 100 will be described.

Figure 10:
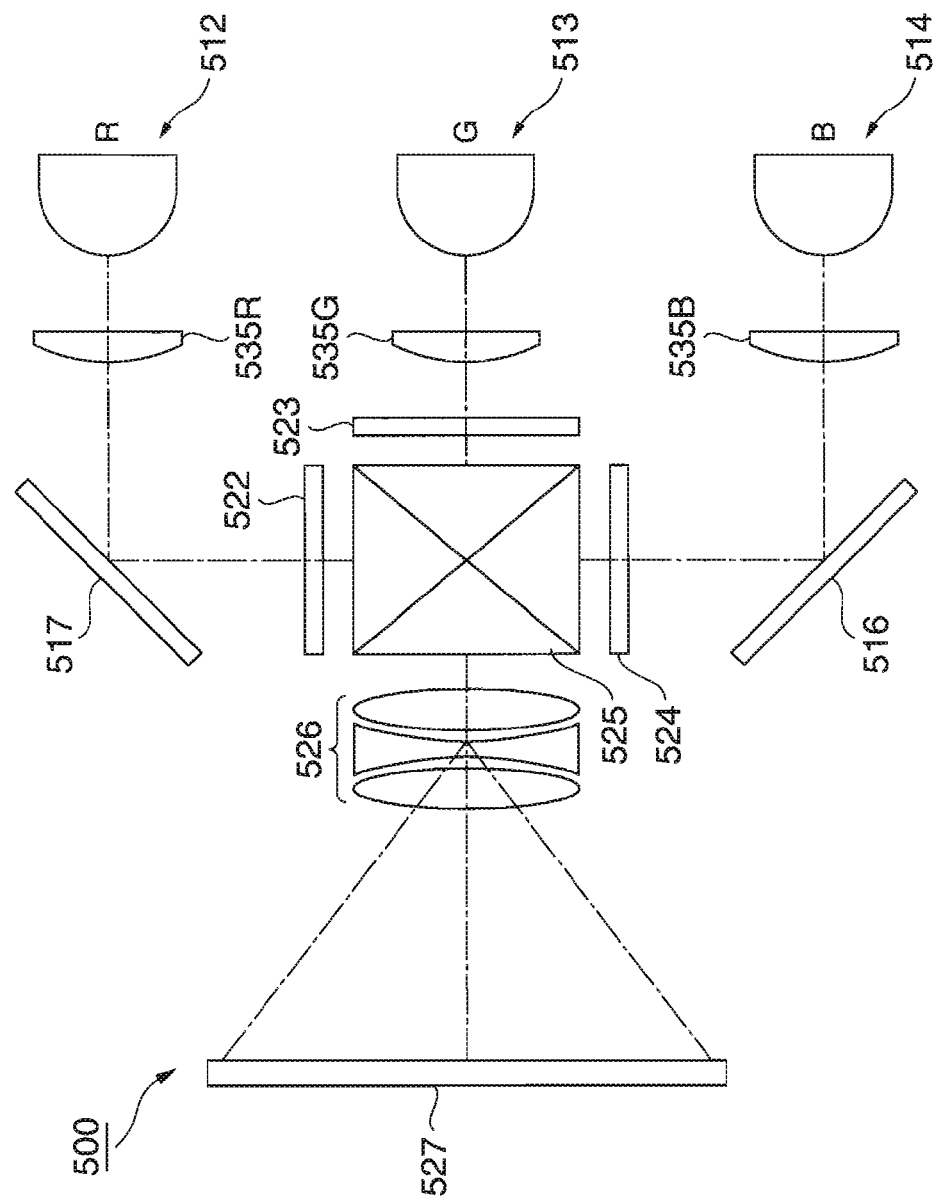
FIG. 10 is a pattern diagram showing a schematic configuration of a projector.
Figure 11A:
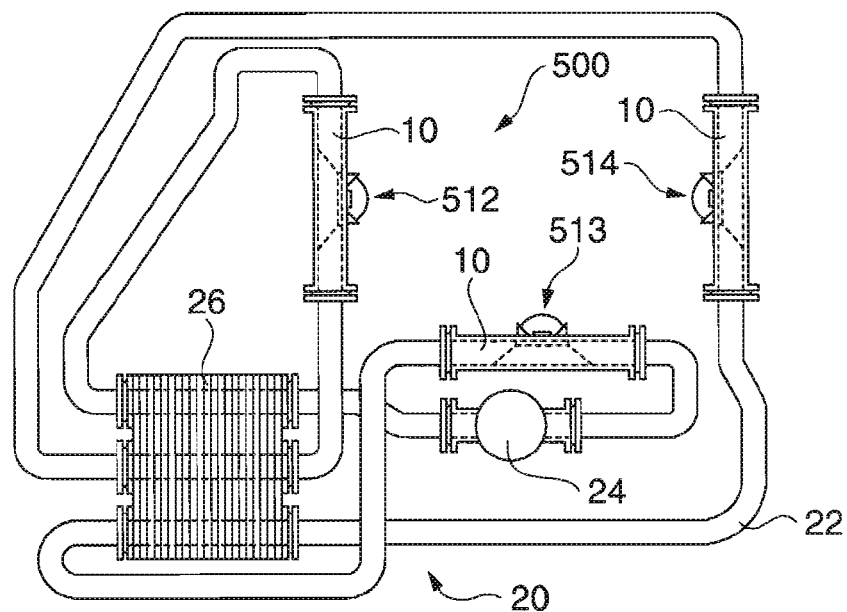
FIGS. 11A and 11B are drawings showing a piping configuration of the liquid cooling system provided in the projector.
Figure 11B:
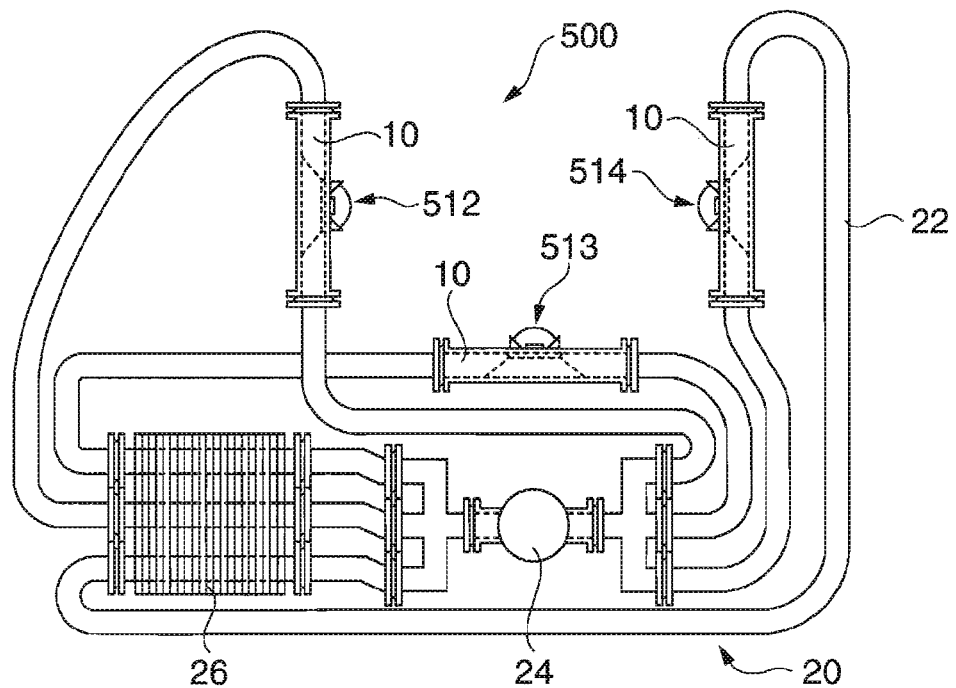

FIG. 10 is a pattern diagram showing a schematic configuration of the projector 500. FIGS. 11A and 11B are drawings showing a piping configuration of the liquid cooling system provided in the projector 500.

The projector 500 includes light source devices 512, 513, 514, liquid crystal light valves 522, 523, 524, a cross dichroic prism 525 and a projection lens 526.

The three light source devices 512, 513, 514 are composed of the light source device 100. The respective light source devices 512, 513, 514 employ LED chips which emit light in red (R), green (G) and blue (B) respectively. As a uniform illumination system for uniformizing the illuminance distribution of light from the light source, a rod lens or a fly eye lens may be arranged rearwardly of the respective light source devices.

A luminous flux from the red light source device 512 passes through a superimposed lens 535R, is reflected from a reflection mirror 517, and enters into a red light liquid crystal light valve 522. A luminous flux from the green light source device 513 passes through a superimposed lens 535G and enters into a green light liquid crystal light valve 523.

A luminous flux from the blue light source device 514 passes through a superimposed lens 535B, is reflected from a reflection mirror 516, and enters into a blue light liquid crystal light valve 524.

When an fly eye lens is employed as a uniform illumination system, the luminous fluxes from the respective light sources are superimposed on a display area of the liquid crystal light valve by passing through the superimposed lens, so that the liquid crystal light valve is uniformly illuminated.

Deflecting plates (not shown) are arranged on light-incoming sides and light-emitting sides of the respective liquid crystal light valves 522,523,524. Then, only linearly polarized light in the predetermined direction out of the luminous fluxes from the respective light source devices 512, 513, 514 pass through the deflecting plates on the light-incoming sides, and enter into the respective liquid crystal light valves 522, 523, 524.

It is also possible to provide deflecting light converting means (not shown) forwardly of the deflecting plates on the light-incoming sides. In this case, the luminous fluxes reflected from the deflecting plates on the light-incoming sides can be recycled and caused to enter the respective liquid crystal light valves, whereby luminous efficiency can be improved.

The three color lights modulated by the respective liquid crystal light valves 522, 523, 524 enter the cross dichroic prism 525. This prism is formed by bonding four rectangular prisms, and a dielectric multilayer film for reflecting red light and a dielectric multilayer film for reflecting blue light are arranged in a cross-shape on the inner surface thereof. These dielectric multilayer films combine three color lights and generate light for displaying a color image.

The combined light is projected on a projecting screen 527 by the projecting lens 526 as the projecting optical system and an enlarged image is displayed thereon.

Since the light source devices 512, 513, 514 in the above described embodiment is provide with the liquid cooling system 20 for cooling the LED chip, it can be improved in intensity and provided at a low cost. Therefore, the projector 500 with high display performance can be provided at a low cost.

The piping configuration of the liquid cooling system 20 for the light source devices 512, 513, 514 may be either one of a series piping shown in FIG. 11A or a parallel piping shown in FIG. 11B.

Although the LED chip is employed as the solid light-emitting light source, it is also possible to employ the semiconductor laser or the like as the solid light-emitting light source. In addition, in the above-described projectors the liquid crystal light valve is employed as the light modulating means. However, a minute mirror array device or the like may also be employed as the light modulating means.

Electronic Device Unit, Electronic Equipment

Subsequently, an electronic device unit 700 provided with the liquid cooling system 20 and an information processing apparatus 800 will be described.

Figure 12:
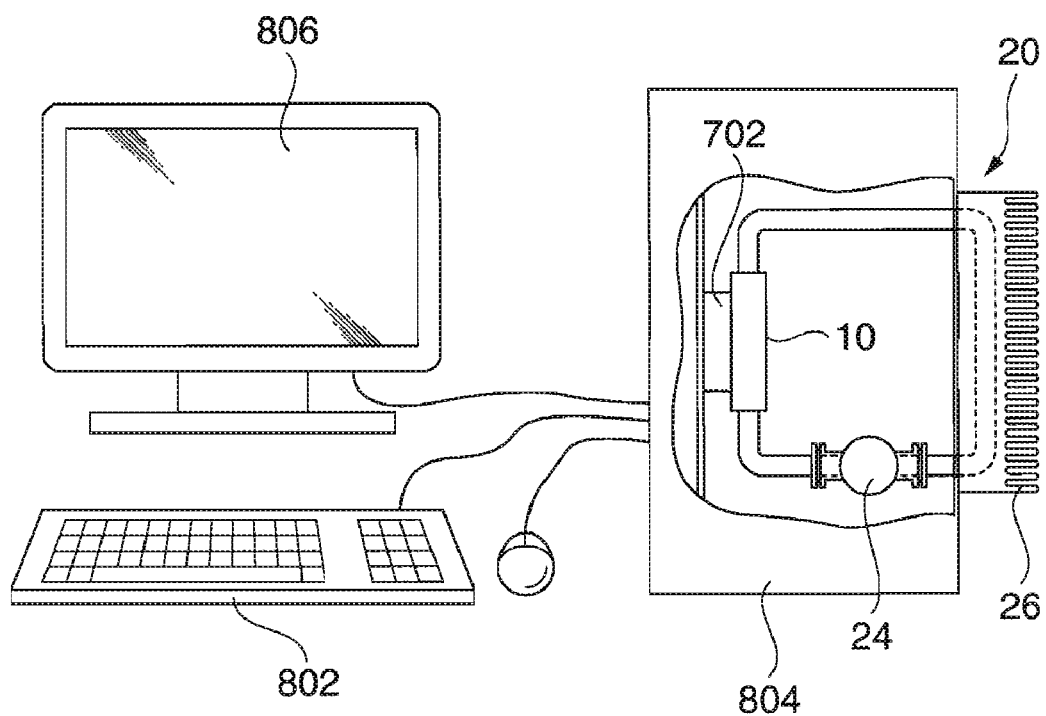
FIG. 12 is a drawing showing a schematic configuration of an information processing apparatus.

FIG. 12 is a pattern diagram showing an example of the information processing apparatus 800 such as a personal computer.

The information processing apparatus (electronic equipment) 800 is provided with an input unit 802 such as a keyboard, an information processing apparatus body (housing) 804, a display unit 806, and so on.

The electronic device unit 700 including a CPU (central processing unit) 702 and the liquid cooling system 20 is provided in the interior of the information processing apparatus body 804. A micro pump is preferably used as a pump for the liquid cooling system 20 to be applied to the electronic device unit.

The CPU is controlled to a certain constant temperature or lower by the liquid cooling system 20 which absorbs heat generated during driving. Accordingly, a high throughput can be achieved. Therefore, the information processing apparatus 800 having an advanced computing capability is realized.

The electronic equipment provided with the electronic device unit 700 is not limited to the information processing apparatus 800. It may be any electronic equipment as long as it has the heat generating member H to be cooled to a certain constant temperature or lower.

Although the preferred embodiments of the heat exchanger, the liquid cooling system, the light source device, the projector, the electronic device unit and the electronic equipment according to the aspects of the invention have been described thus far while referring to she drawings, the invention is not limited to the above-described embodiments as a matter of course. The shapes, combinations or the like of the components shown in the embodiments described above are illustrative only, and may be modified variously depending on design requirements or the like without departing the scope of the invention.

For example, liquid to be supplied to the interior (flow channel) of the heat exchanger is not limited to water. It may be any liquid as long as it is suitable as cooling medium.

The entire disclosure of Japanese Application Nos: 2005-292192, filed Oct. 5, 2005 and 2006-025761, filed Feb. 2, 2006 are expressly incorporated by reference herein.

What is claimed is:

1. A heat exchanger having a plurality of fine flow channels comprising:
    a first laminating plate,
    a second laminating plate, which constitutes liquid feeding pipes arranged of either side of the second laminating plate,
    a plurality of first thin plate members, each first thin plate member being formed with a first void in a middle of the first thin plate member, which defines a respective fine flow channel,
    a plurality of second thin plate members, each second thin plate member constituting a first partitioning wall in a middle of the second thin plate member and defining a respective fine flow channel on either side of the first partitioning wall,
    a plurality of third thin plate members, each third thin plate member being formed with a second void in a middle of the third thin plate member, which defines a respective fine flow channel, and an introduction flow path, being formed on both sides of the second void between an outer edge of the third thin plate member and the second void, a plurality of fourth thin plate members, each fourth thin plate member constituting a second partitioning wall in a middle of the fourth thin plate member, defining a respective fine flow channel on either side of the second partitioning wall, and the introduction flow path, being formed on both sides of the second partitioning wall between an outer edge of the fourth thin plate member and the second partitioning wall, wherein:

the introduction flow path guides the liquid flow from one of the liquid feeding pipes into the heat exchanger, and then guides the liquid flow to an area that is a substantially center portion of the heat exchanger, the plurality of first thin plate members and the plurality of second thin plate members are bonded by diffusion bonding alternately to form alternating first thin plate members and second thin plate members, and the alternating first thin plate members and second thin plate members, including the first partitioning walls, are disposed in a direction perpendicular to the liquid feeding pipes, the plurality of third thin plate members and the plurality of fourth thin plate members are bonded by diffusion bonding alternately to form alternating third thin plate members and fourth thin plate members, and the alternating third thin plate members and fourth thin plate members, including the second partitioning walls, are disposed in a direction perpendicular to the liquid feeding pipes, the alternating first thin plate members and second thin plate members are disposed on the first laminating plate, the alternating third thin plate members and fourth thin plate members are disposed on the alternating first thin plate members and second thin plate members, and the second laminating plate is disposed on the alternating third thin plate members and fourth thin plate members.

* * * * *